United States Patent
Chang et al.

(10) Patent No.: US 10,504,906 B2
(45) Date of Patent: Dec. 10, 2019

(54) FINFET SRAM LAYOUT AND METHOD OF MAKING THE SAME

(71) Applicant: GLOBALFOUNDRIES Inc., Grand Cayman (KY)

(72) Inventors: Ming-Cheng Chang, Dresden (DE); Nigel Chan, Dresden (DE); Ralf Van Bentum, Moritzburg Saxony (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/830,671

(22) Filed: Dec. 4, 2017

(65) Prior Publication Data
US 2019/0172832 A1 Jun. 6, 2019

(51) Int. Cl.
| H01L 27/11 | (2006.01) |
| H01L 21/8238 | (2006.01) |
| H01L 27/02 | (2006.01) |
| H01L 29/423 | (2006.01) |
| H01L 27/092 | (2006.01) |

(52) U.S. Cl.
CPC .. *H01L 27/1104* (2013.01); *H01L 21/823821* (2013.01); *H01L 21/823828* (2013.01); *H01L 27/0207* (2013.01); *H01L 27/0924* (2013.01); *H01L 29/42356* (2013.01)

(58) Field of Classification Search
CPC .. H01L 27/1104; H01L 27/11; H01L 27/0207; H01L 27/0886; H01L 29/785; H01L 29/7855
See application file for complete search history.

(56) References Cited

U.S. PATENT DOCUMENTS

| 5,973,376 | A | 10/1999 | Rostoker et al. | |
| 6,407,434 | B1 | 6/2002 | Rostoker et al. | |
| 6,867,460 | B1 | 3/2005 | Anderson et al. | |
| 7,143,383 | B1 | 11/2006 | Teig et al. | |
| 9,466,718 | B2 * | 10/2016 | Morin | H01L 29/7848 |
| 2003/0102518 | A1 * | 6/2003 | Fried | H01L 21/84 257/401 |
| 2005/0121676 | A1 * | 6/2005 | Fried | H01L 21/84 257/72 |
| 2006/0154426 | A1 * | 7/2006 | Anderson | H01L 29/42384 438/300 |
| 2007/0063276 | A1 * | 3/2007 | Beintner | H01L 21/845 257/347 |
| 2008/0035956 | A1 | 2/2008 | Manning | |
| 2009/0121291 | A1 * | 5/2009 | Anderson | H01L 27/0207 257/365 |
| 2017/0054027 | A1 * | 2/2017 | Liu | H01L 29/7855 |

* cited by examiner

*Primary Examiner* — Scott B Geyer
(74) *Attorney, Agent, or Firm* — Ditthavong & Steiner, P.C.

(57) ABSTRACT

A method of forming a finFET SRAM and related device, are provided. Embodiments include forming a plurality of silicon fins in a substrate; and forming a gate over each of the fins, wherein all of the fins are diagonally skewed in a single direction relative to the gates, and all of the gates extend in a single direction relative to the respective fins.

18 Claims, 4 Drawing Sheets

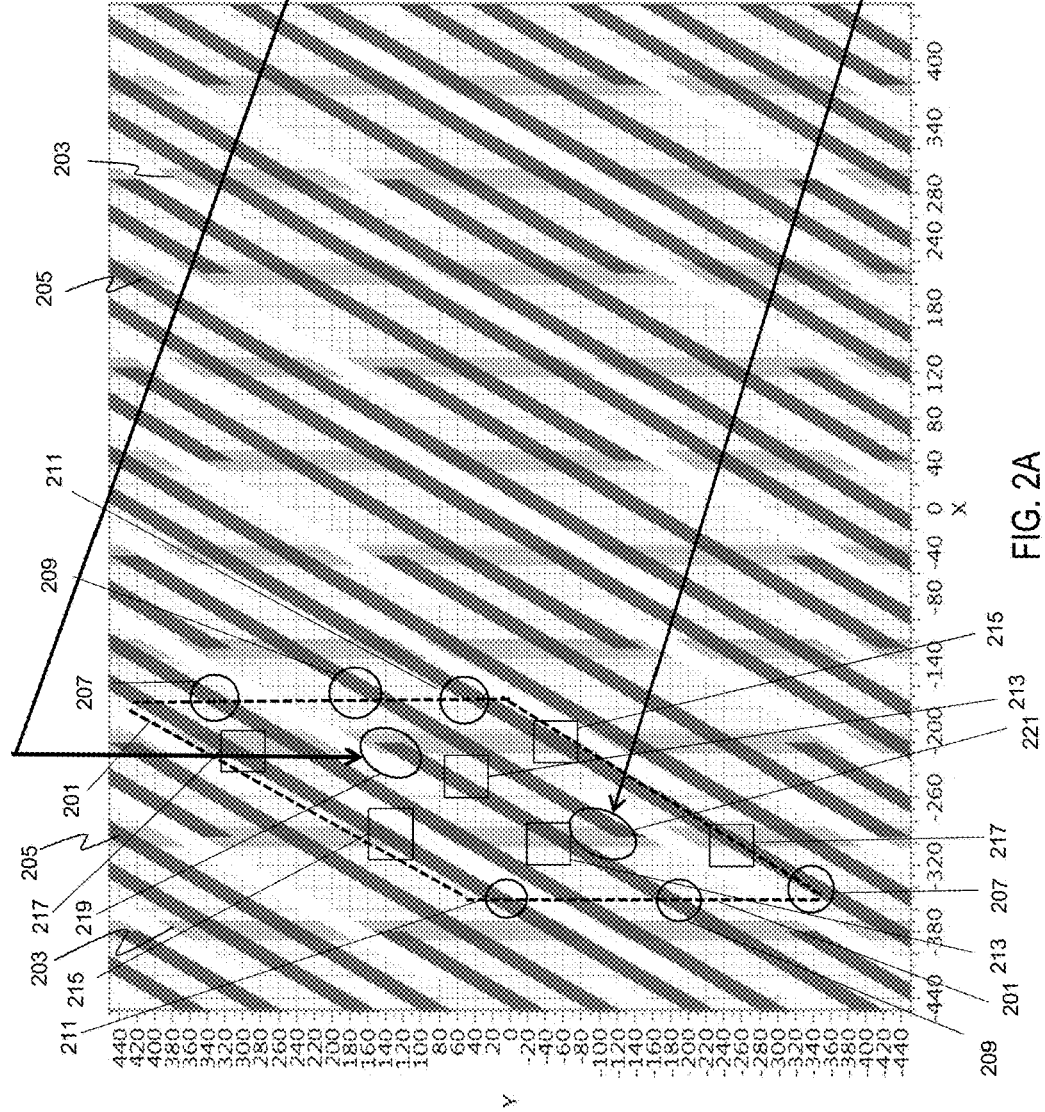
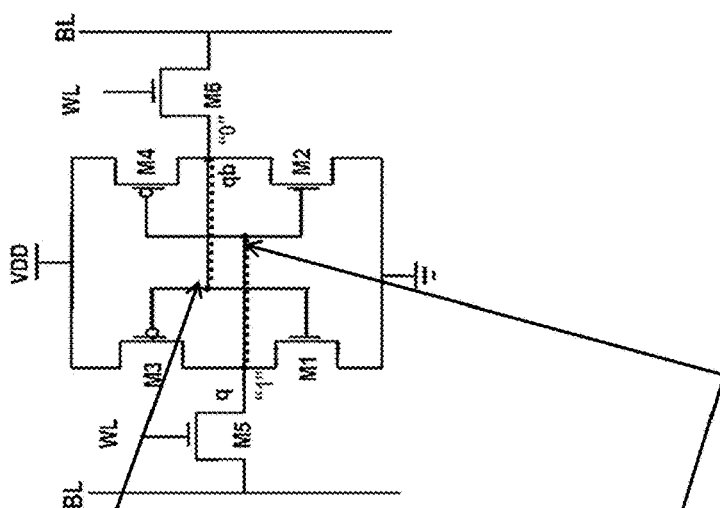
FIG. 2A
FIG. 2B

FINFET SRAM LAYOUT AND METHOD OF MAKING THE SAME

TECHNICAL FIELD

The present disclosure relates to semiconductor fabrication. In particular, the present disclosure relates to fin field effect transistors (finFETs) in advanced technology nodes.

BACKGROUND

Transistors have been continuously scaled down in size to increase performance and reduce power consumption. This has led to the advent of more efficient, scalable electronic devices and increased user experiences. However, as transistors have decreased in size, the complexity of manufacturing them for optimal performance has increased. One area of challenge faced by manufacturers of transistors is cell layout variability for static random access memory (SRAM). As cell size of SRAM shrinks, variability in design layout becomes limited. Variability is related to effective channel width (Weff) and the effective channel length (Leff) of semiconductor devices. Prior approaches for SRAM cell on finFET includes an orthogonal layout for the SRAM cell, wherein silicon fins are formed at a 90 degree angle relative to the overlying gate. Unfortunately, there is insufficient variability available with the orthogonal design layout As shown in FIG. 1, a conventional finFET structure with an orthogonal design is illustrated with a gate 101 and a fin 103 extending through the overlying gate in an orthogonal direction relative to the gate 101. The gate has a length (Lg) that is illustrated between directional arrows 111a and 111b. The fin 103 includes source region 105 and drain region 107 and has a fin height (Fin_H) 109a and fin width (Fin_W) 109b. The fin width in this illustration is 10 nanometers (nm) and the fin height is calculated by the device width divided by two. Weff is calculated by the following equation:

$$Weff = 2 \times Fin\_H + Fin\_W$$

A need therefore exists for forming a finFET based design layout that is suitable for implementation of SRAM cells, and for implementation of integrated circuits using finFET architectures with flexible layout features to allow for cell shrinkage, and the resulting device.

SUMMARY

An aspect of the present disclosure is a novel design layout which enables the finFET SRAM cell to decrease in size into high density 5 nm technology nodes and beyond. Further aspects include a novel design layout that is fixed at the fin and enlarges Leff*Weff at a constant X and Y pitch. The rotation of fin direction relative to the gate increase Leff. Another aspect of the present disclosure is to design a larger Lg that is longer to improve variability and improves short channel effect (SCE) and local threshold voltage (Vt) mismatch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a plurality of silicon fins in a substrate; and forming a gate over each of the fins, wherein all of the fins are diagonally skewed in a single direction relative to the gates, and wherein all of the gates extend in a single direction relative to the respective fins.

Aspects include forming the fins and gates as a fin field effect transistor (finFET) memory device. Other aspects include the finFET memory device including a SRAM cell. In certain aspects, the SRAM cell includes a six transistor finFET SRAM high density (HD) cell. Certain aspects include the single direction of the fins being non-orthogonal. Other aspects include the single direction of the gates being non-orthogonal. Aspects include forming each fin at an angle of 50 to 70 degrees relative to the respective gate. Still further aspects include forming each fin at an angle of 66 degrees relative to the respective gate. Additional aspects include forming source/drain (S/D) contacts in a diagonally skewed direction relative to the gates.

Another aspect of the present disclosure is a device including a plurality of silicon fins formed in a substrate; and a gate formed over each of the fins, wherein all of the fins are diagonally skewed in a single direction relative to the gates, and wherein all of the gates extend in a single direction relative to the respective fins.

Aspects include the fins and gates formed as a fin field effect transistor (finFET) memory device. Other aspects include the finFET memory device including a SRAM cell. In certain aspects, the SRAM cell includes a six transistor finFET SRAM high density (HD) cell. Certain aspects include the single direction of the fins being non-orthogonal. Other aspects include the single direction of the gates being non-orthogonal. Aspects include each fin formed at an angle of 50 to 70 degrees relative to the respective gate. Still further aspects include each fin formed at an angle of 66 degrees relative to the respective gate. Additional aspects include source/drain (S/D) contacts formed in a diagonally skewed direction relative to the gates.

In yet another aspect, the present disclosure includes a method including forming a plurality of silicon fins in a substrate; and forming a gate over each of the fins, wherein all of the fins are diagonally skewed in a single direction at an angle relative to the gates, wherein all of the gates extend in a single direction relative to the respective fins, and the fins and gates comprise a six transistor finFET SRAM high density (HD) cell.

Additional aspects of the present disclosure include forming each fin at an angle of 66 degrees relative to the respective gate.

Additional aspects and technical effects of the present disclosure will become apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2C are finFET design plot/layouts; and FIGS. 2B and 2D are corresponding circuit diagrams for an SRAM cell, in accordance with an exemplary embodiment.

DETAILED DESCRIPTION

Figure 1:
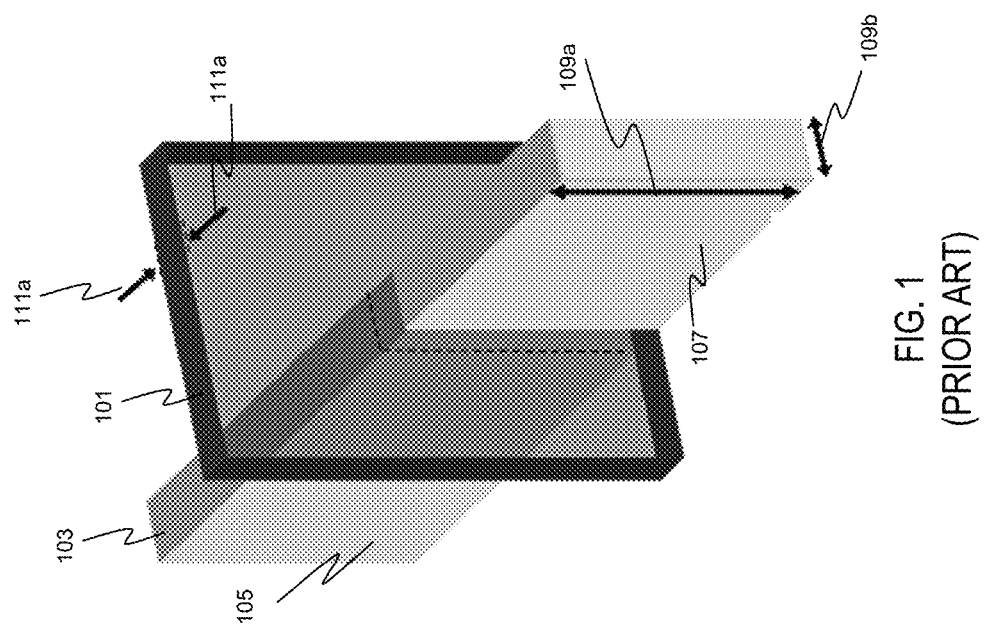
FIG. 1 schematically illustrates a conventional finFET device.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of limited variability of finFETs with orthogonal layouts, by proving a novel design layout suitable for SRAM HD cells on finFETs. The present disclosure provides a plurality of silicon fins formed in a substrate; and a gate formed over each of the fins, wherein all of the fins are diagonally skewed in a single direction relative to the gates, and wherein all of the gates extend in a single direction relative to the respective fins.

Still other aspects, features, and technical effects will be apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 2A illustrates a top view of a diagonal finFET plot/layout, in accordance with an exemplary embodiment. The diagonal finFET layout includes a SRAM cell, represented by dashed lines of the parallelogram 201 positioned within the X and Y axis of the plot/layout. FIG. 2B illustrates the corresponding circuit diagram for the SRAM cell. The diagonal finFET ploy/layout includes a plurality of gates 203 and fins 205. Each intersection of gate and fin represents a transistor. In this embodiment, the angle of each fin 205 relative to a respective gate 203 is between 50 to 70 degrees. In certain embodiments the angle of each fin 205 relative to a respective gate is 66 degrees.

The SRAM cell 201 plot/layout illustrated in FIG. 2A has a size of 168 (X-axis) by 380 (Y-axis) nm$^2$. The dimensions along the X-axis and Y-axis represent size of unit SRAM cell. The gate length in the diagonal direction (Lg_d) is 44 nm compared a conventional orthogonal layout (with a SRAM cell size of 168*380 nm$^2$) having an Lg_d of 18 nm. The Lg is 18 nm in this embodiment compared to a conventional orthogonal layout which has an Lg of only 10 nm. The contacted poly-pitch (CPP) is 84 nm and the fin pitch is 46 nm. Thus, the diagonal layout provides for a longer effective Lg at the same CPP. The Weff*Leff is two-times larger and increases variability with layout design. The ratio of PU devices 217 to PD devices 215 to PG devices 219 is 1:1:1. In FIG. 2B, metal layers (M1 through M6) are illustrated together with bit lines (BL) and word lines (WL). A short is illustrated at M3/M1 and "0" 219. A short is illustrated at M4/M2 and "1" 221. Contacts 207, 209 and 211 are contacts down to active silicon area of fins 205 to S/D regions.

Figure 2C:
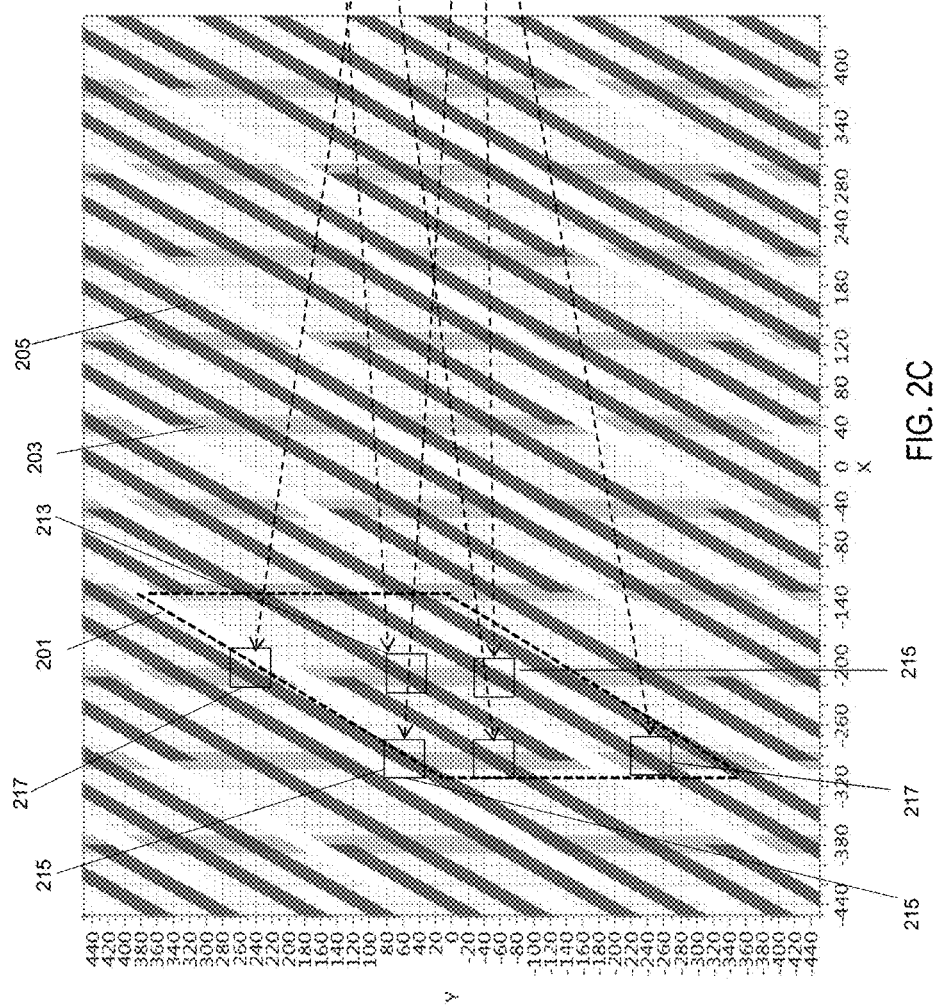
Figure 2D:
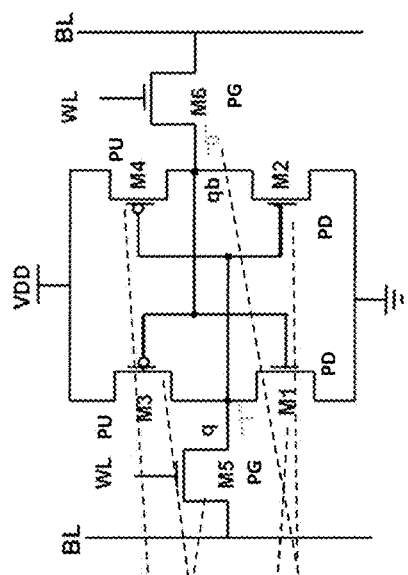

In FIG. 2C, another example of an SRAM cell 201 plot/layout having a size of 168*380 nm$^2$ is illustrated. The transistor devices relative to the metal layers (M1 through M6) is shown in FIG. 2D. The ratio of PU devices 217 to PD devices 215 to PG devices 219 is 1:1:1, respectively. The critical dimensions for the gate (PCCD) and CPP are reduced with the diagonal layout in FIG. 2C. The PCCD for a conventional layout of similar SRAM cell size is limited by SCE to a technology node of 20 nm.

Figure 3B:
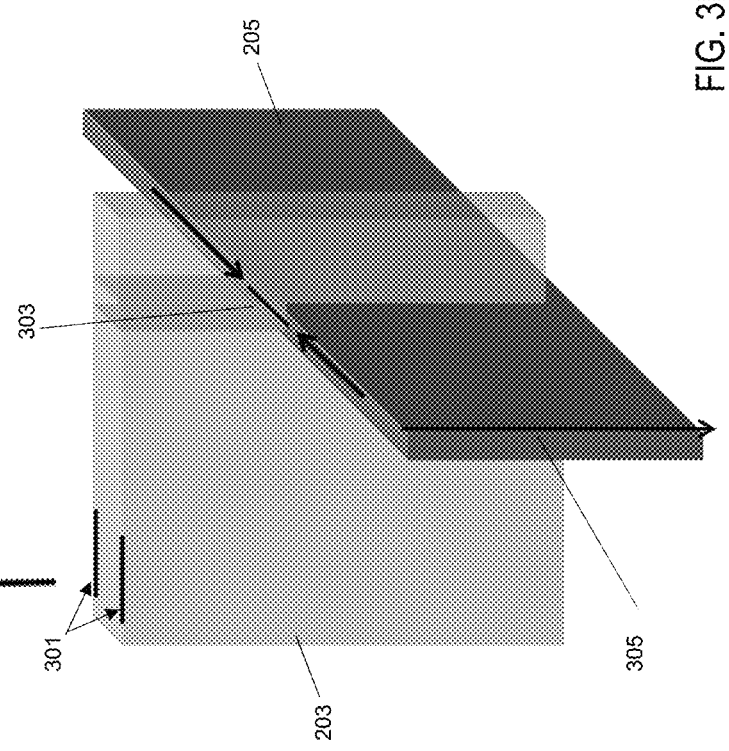
FIGS. 3A and 3B are top and three-dimensional views of a finFET layout for SRAM, respectively, in accordance with an exemplary embodiment.
Figure 3A:
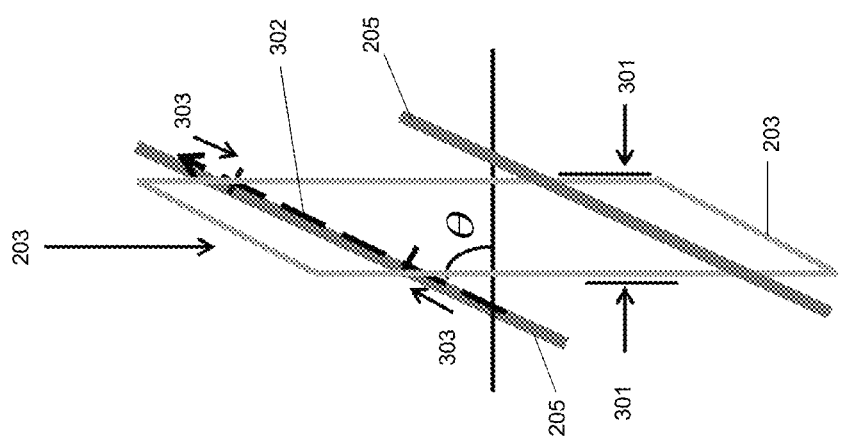

FIG. 3A illustrates a top view of the finFET device and FIG. 3B illustrates a three-dimensional view of the finFET device. In FIG. 3A, fins 205 extend under and through gate 203. The gate 203 has an Lg that is illustrated between directional arrows 301. Current flow is represented by dashed directional arrow 302. Leff 303 in this example is 44 nm. Weff 305 is shown in FIG. 3B. The angle θ in this example is 66.15 degrees, which reflects each fin 205 formed at an angle of 66.15 degrees relative to the gate 203.

The embodiments of the present disclosure can achieve several technical effects including increased variability of finFET SRAM in advanced technology nodes. Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices, including system-on-chip (SoC) products having SRAM usage. The present disclosure is particularly applicable in SRAM cell on finFET devices, in the advanced technology nodes, including, in particular, a six transistor finFET SRAM high density (HD) cell.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
  forming a plurality of silicon fins in a substrate;
  forming a gate over each of the fins; and
  forming source/drain (S/D) contacts in a diagonally skewed direction relative to the gates; and
  wherein all of the fins are diagonally skewed in a single direction relative to the gates, and
  wherein all of the gates extend in a single direction relative to the respective fins.
2. The method according to claim 1, comprising:
  forming the fins and gates as a fin field effect transistor (finFET) memory device.
3. The method according to claim 2, wherein the finFET memory device comprises static random-access memory (SRAM) cell.

4. The method according to claim 3, wherein the SRAM cell comprises a six transistor finFET SRAM high density (HD) cell.

5. The method according to claim 1, wherein the single direction of the fins is non-orthogonal relative to the respective gates.

6. The method according to claim 1, wherein the single direction of the gates is non-orthogonal relative to the respective fins.

7. The method according to claim 1, comprising:
forming each fin at an angle of 50 to 70 degrees relative to the respective gate.

8. The method according to claim 7, comprising:
forming each fin at an angle of 66 degrees relative to the respective gate.

9. A device comprising:
a plurality of silicon fins formed in a substrate; and
a gate formed over each of the fins,
wherein all of the fins are diagonally skewed in a single direction relative to the gates, and
wherein all of the gates extend in a single direction relative to the respective fins, and
wherein the finFET memory device comprises static random-access memory (SRAM) cell.

10. The device according to claim 9, comprising:
the fins and gates formed as a fin field effect transistor (finFET) memory device.

11. The device according to claim 9, wherein the SRAM cell comprises a six transistor finFET SRAM high density (HD) cell.

12. The device according to claim 9, wherein the single direction of the fins is non-orthogonal relative to the respective gates.

13. The device according to claim 9, wherein the single direction of the gates is non-orthogonal relative to the respective fins.

14. The device according to claim 9, comprising:
each fin formed at an angle of 50 to 70 degrees relative to the respective gate.

15. The device according to claim 14, comprising:
each fin formed at an angle of 66 degrees relative to the respective gate.

16. The device according to claim 9, further comprising:
source/drain (S/D) contacts formed in a diagonally skewed direction relative to the gates.

17. A method comprising:
forming a plurality of silicon fins in a substrate; and
forming a gate over each of the fins,
wherein all of the fins are diagonally skewed in a single direction at an angle relative to the gates,
wherein all of the gates extend in a single direction relative to the respective fins, and
the fins and gates comprise a six transistor finFET SRAM high density (HD) cell.

18. The method according to claim 17, comprising:
forming each fin at an angle of 66 degrees relative to the respective gate.

* * * * *